United States Patent
Witzigmann et al.

(10) Patent No.: US 7,042,921 B2
(45) Date of Patent: May 9, 2006

(54) COMPLEX COUPLED SINGLE MODE LASER WITH DUAL ACTIVE REGION

(75) Inventors: Bernd Witzigmann, Burbank, CA (US); Charles Tsai, Hacienda Heights, CA (US)

(73) Assignee: Emcore Corporation, Somerset, NJ (US)

( * ) Notice: Subject to any disclaimer, the term of this patent is extended or adjusted under 35 U.S.C. 154(b) by 283 days.

(21) Appl. No.: 10/618,373

(22) Filed: Jul. 11, 2003

(65) Prior Publication Data

US 2005/0008053 A1 Jan. 13, 2005

(51) Int. Cl.
*H01S 3/08* (2006.01)
*H01S 5/00* (2006.01)
*H01S 3/14* (2006.01)

(52) U.S. Cl. .................. 372/96; 372/50.11; 372/68
(58) Field of Classification Search ............. 372/43.01, 372/68, 96, 50.11
See application file for complete search history.

(56) References Cited

U.S. PATENT DOCUMENTS

| | | | |
|---|---|---|---|
| 4,881,238 A * | 11/1989 | Chinone et al. ............... | 372/68 |
| 5,329,135 A | 7/1994 | Terakado | |
| 5,349,596 A | 9/1994 | Molva et al. | |
| 5,747,827 A | 5/1998 | Duggan et al. | |
| 5,771,256 A | 6/1998 | Bhat | |
| 5,914,496 A | 6/1999 | Thijs et al. | |
| 5,929,462 A | 7/1999 | Kasukawa et al. | |
| 5,953,361 A * | 9/1999 | Borchert et al. .............. | 372/96 |
| 5,981,986 A | 11/1999 | Tsuchiya | |
| 6,011,811 A | 1/2000 | Öhlander et al. | |
| 6,288,410 B1 | 9/2001 | Miyazawa | |
| 6,426,515 B1 | 7/2002 | Ishikawa et al. | |
| 6,898,224 B1 * | 5/2005 | Yokozeki et al. ........ | 372/49.01 |
| 6,925,103 B1 | 8/2005 | Ishikawa et al. | |
| 2001/0032976 A1 * | 10/2001 | Ishikawa et al. .............. | 257/14 |
| 2002/0009116 A1 * | 1/2002 | Kobayashi et al. ........... | 372/96 |

OTHER PUBLICATIONS

Tsang et al., "Semiconductor distributed feedback lasers with quantum well or superlattice gratings for index or gain-coupled optical feedback," Applied Physics Letters, vol. 60 No. 21, p. 2580, May 25, 1992.*

* cited by examiner

*Primary Examiner*—James Menefee
(74) *Attorney, Agent, or Firm*—Christie, Parker & Hale, LLP

(57) ABSTRACT

A semiconductor complex coupled light emitting device is disclosed having a lower cladding layer, an optical cavity formed adjacent the lower cladding layer and an upper cladding layer formed adjacent the optical cavity. The optical cavity includes a lower multi-quantum well active region formed from a first high reactivity material system and an upper multi-quantum well diffraction grating structure formed from a second low reactivity material system that is not subject to oxidation when etched.

25 Claims, 4 Drawing Sheets

COMPLEX COUPLED SINGLE MODE LASER WITH DUAL ACTIVE REGION

BACKGROUND

Distributed feedback semiconductor lasers (hereinafter, referred to as "DFB lasers") are commonly used as light sources for long distance and large capacity optical data communication along optical fiber links. In addition, single mode DFBs have well-defined rise and fall times of the single optical mode as may be required for high data rate applications.

Many approaches for controlling the mode spectrum of DFB lasers have been developed in recent years. For example, index coupled devices which include periodic variations of the refractive index in the cavity length direction have been commonly employed to provide single longitudinal mode oscillation at a wavelength corresponding to the period of change of the refractive index. However, index-coupled DFB lasers tend to produce a pair of longitudinal oscillation modes having equal threshold gain which often results in multi-mode operation.

Mode degeneracy in index coupled lasers has been controlled to some extent with facet coatings applied to each end face of the laser to provide asymmetric reflectivity for the oscillation modes. Facet coatings, however, may not ensure single mode operation because of the random facet phases introduced by end face cleaving. Therefore, even with such asymmetric coatings, the probability that an index-coupled DFB laser device will oscillate in a desired single longitudinal mode is only about 50–70%.

In contrast, complex-coupled DFBs, which periodically vary the gain in the cavity length direction, oscillate in a single mode having a reduced threshold gain. In conventional gain-coupled semiconductor DFB lasers, light is fed back by a perturbation in the gain or loss coefficient provided by a diffraction grating in addition to the index perturbation.

The grating is typically generated by etching grooves through a multi-quantum well active region and re-growing a buffer material in the etched grooves. The grating in conventional devices is not formed from high reactivity materials, such as for example, aluminum. High reactivity materials essentially oxidize immediately when exposed to air after being etched complicating the regrowth process. Therefore, in conventional devices, the multi-quantum well active region that is etched to form a grating is commonly formed from low reactivity materials, such as, for example, InGaAs/InGaAsP or the like which do not oxidize when etched so that re-growth over the grating may be more readily accomplished.

However, commonly used, low reactivity material systems typically have relatively small conduction band offsets with relatively poor carrier confinement which may create a significant thermally activated electron leakage current. The leakage current may result in higher laser threshold currents and poor system performance as a function of temperature.

SUMMARY

In one aspect of the present invention a light emitting device includes a lower cladding layer, an optical cavity formed adjacent the lower cladding layer, the optical cavity having a lower active region formed from a first material system and an upper active region formed from a second material system and an upper cladding layer formed adjacent the optical cavity.

BRIEF DESCRIPTION OF THE DRAWINGS

These and other features, aspects, and advantages of the present invention will become better understood with regard to the following description, appended claims, and accompanying drawings where:

DETAILED DESCRIPTION

An exemplary embodiment of the present invention comprises a single-mode semiconductor laser. In one embodiment the single-mode performance is achieved by etching a grating into part of the active material in the optical cavity to form a complex-coupled DFB laser. In this embodiment the optical cavity comprises a lower active region and an upper active region formed from different material systems.

Figure 1:
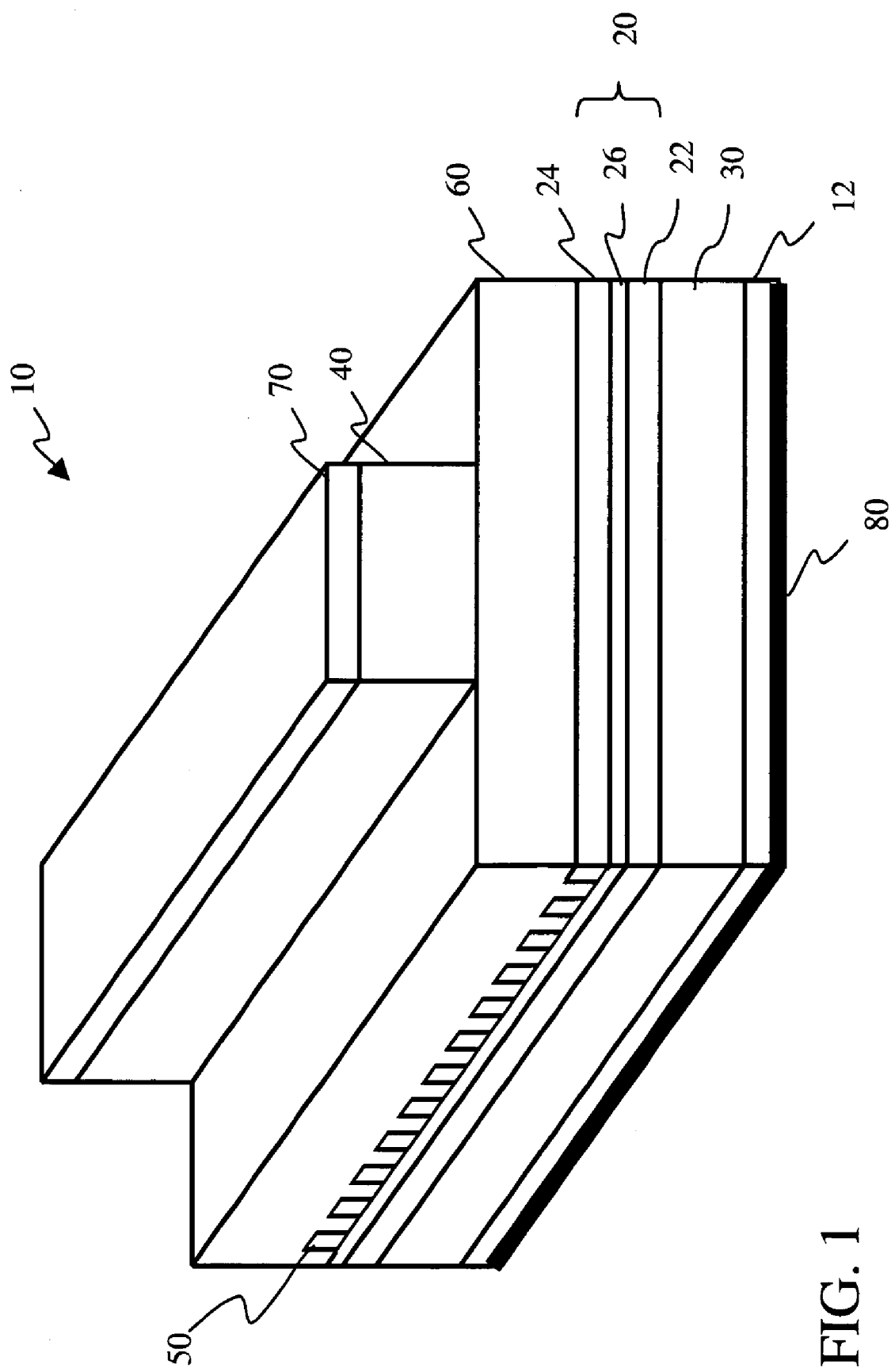
FIG. 1 is a perspective view of a light emitting device having a lower active region and an upper active region in accordance with an exemplary embodiment of the present invention.

For example, FIG. 1 is a perspective view of a complex coupled, single mode DFB laser 10. As is well known in the art the illustrated DFB laser 10 may be epitaxially grown, doped, and contacted. In addition, the end facets of the laser may receive coatings or other treatment to adjust the amount of optical feedback in the laser diode.

In accordance with common practice the various features illustrated in the drawings are not to scale. On the contrary, the dimensions of the various features are arbitrarily expanded or reduced for clarity. In addition like reference numerals denote like features throughout the specification and figures.

In one embodiment the DFB laser 10 comprises an optical cavity 20 disposed between an n-type layer 30 and a p-type layer 40 formed on an n-doped substrate 12. The optical cavity comprises a lower active region 22 formed from a first material system and an upper active region 24 formed from a second material system and a buffer layer 26 formed between the upper and lower active regions. The upper and lower active regions may comprise a single active layer, a single quantum well structure or a structure having multiple quantum wells, quantum wires or quantum dots.

In one embodiment, the lower active region 22 includes one or more active layers each of which is separated by a barrier layer (not explicitly shown). In this embodiment the lower active region 22 is formed from a first material system with relatively large conduction band offsets that provide relatively stable performance as a function of temperature, relatively high speed, low threshold, etc. In addition, in this embodiment, the lower active region is formed from a high reactivity material system that is susceptible to oxidation when etched. The formation of surface oxides makes it difficult to etch and re-grow these types of materials as required for the formation of a grating for the gain coupled device.

Therefore, the upper active region 24 which includes one or more one active layers, each of which is separated by a barrier layer (not explicitly shown), is formed from a second, relatively passive material system, i.e. one which is not susceptible to oxidation when etched.

In this embodiment a buffer layer 26 comprising a relatively high band gap material that is doped with the same dopant type as the upper cladding layer 40 is formed between the lower active region 22 and the upper active region 24. In one embodiment the buffer layer 26 serves as an etch stop layer during the formation of a periodic grating 50 in the upper active region 24. In this embodiment the material system used to form the upper active region is less prone to oxidation than typical high bandgap compounds used to form the lower active region 22, so re-growth of a filler cap 60 between and over the grating is more readily accomplished.

The semiconductor layers 30 and 40 are, by way of example, formed from a larger-bandgap semiconductor material than that used in the optical cavity, creating an optical waveguide in a plane perpendicular to the junction. In an exemplary embodiment, the p-type layer 40 may be doped with suitable dopants known in the art, such as, for example, zinc (Zn), beryllium (Be) or the like and the n-type layer 30 may be doped with a suitable n-type dopant such as, for example, silicon (Si).

In this embodiment the p-type layer 40 is etched in the shape of a ridge using conventional photolithography. After the ridge is etched, the wafer is, by way of example, coated with an insulating dielectric not shown), such as silicon nitride. In this embodiment the dielectric is then removed from on top of the ridge and a p-type conductive coating or metallization 70 is then applied to the top of the ridge. In an exemplary embodiment an n-type conductive layer or metallization 80 may also be deposited on the backside of the substrate 12 to form an n-type electrical contact.

In operation, when the p-n junction is forward biased, carriers (electrons and holes) are injected into and contained within the upper and lower active regions. The light feedback necessary for the lasing phenomenon and to ensure single mode operation comes from the periodic variation of gain provided by the grating pattern distributed along the structure of the DFB laser. As is known in the art, the grating elements are generally transverse to the propagation direction of the light.

Figure 2:
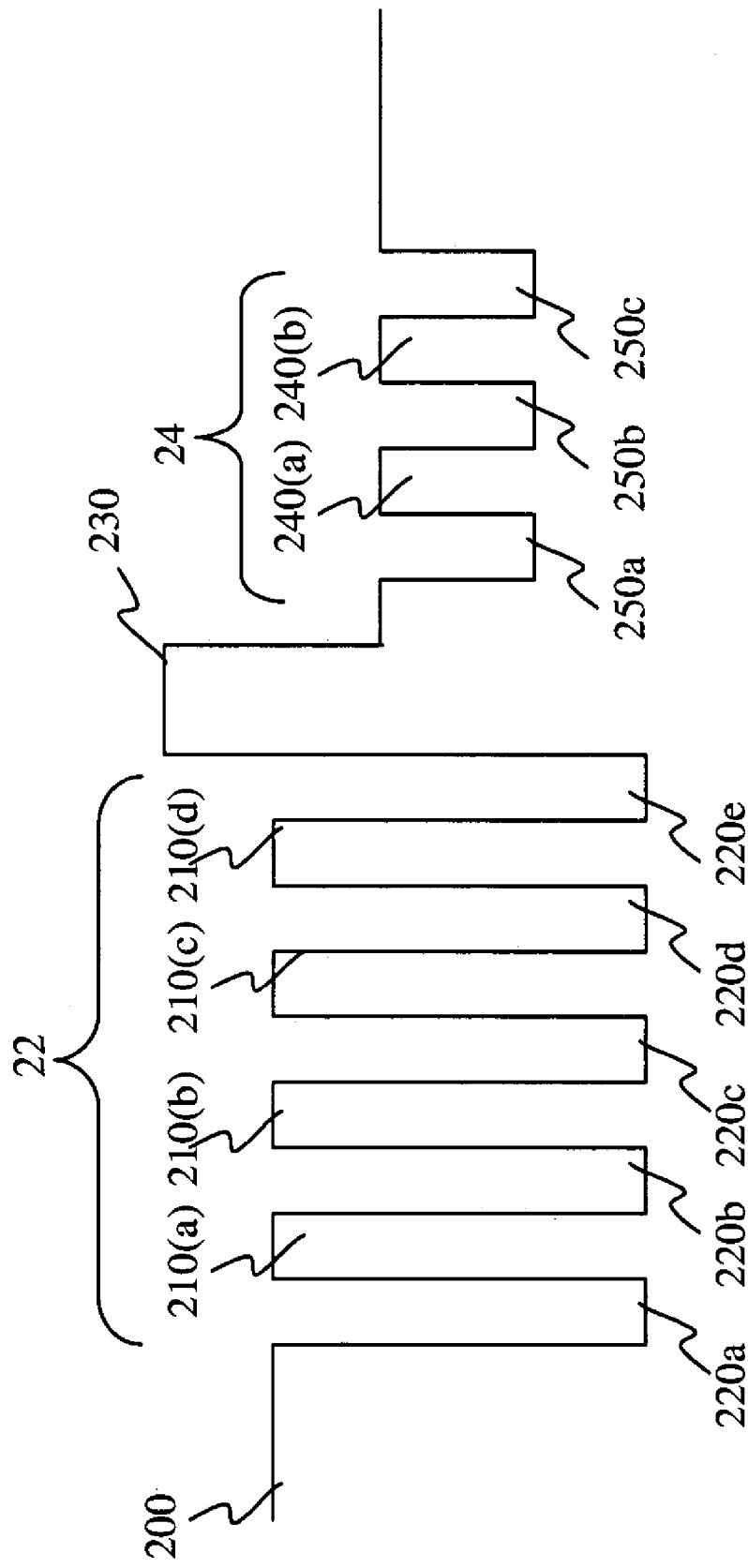
FIG. 2 graphically illustrates the band offsets of the lower and upper active regions of FIG. 1 in accordance with an exemplary embodiment of the present invention.

FIG. 2 is a schematic diagram illustrating the relative conduction band energies of an exemplary optical cavity. Carrier confinement in a semiconductor laser is generally achieved by surrounding the active region with materials having a large bandgap, such that the carriers will be much more likely to populate the active region than the larger bandgap layers. However, during operation thermally excited carriers may escape quantum wells in active regions formed from a material system having relatively small conduction band offsets. The lost carriers create a thermally activated electron leakage current that may result in higher laser threshold currents and poor performance as a function of temperature.

In accordance with an exemplary embodiment the lower active region 22 is formed on a lower separate confinement heterostructure (SCH) 200 having a bandgap that is approximately equal to that of the barrier layers 210(a–d) separating the quantum wells 220(a–e) of the lower active region 22 of the present invention. The barrier layers 210(a–d) and quantum wells 220(a–e) of the lower active region 22 have relatively large conduction band offsets providing improved carrier confinement as compared to traditional complex coupled DFBs.

In this embodiment a buffer layer 230 comprising a relatively high band gap material that is doped with the same dopant type as the upper cladding layer is formed between the lower active region 22 and the upper active region 24. In one embodiment the buffer layer 230 serves as an etch stop layer during the formation of the periodic grating in the upper active region 24.

In this embodiment the upper active region 24 is formed from a conventional material where the conduction band offset is not as large as the offsets for the lower active region. However, the material system used to form the upper active region is not subject to oxidation when etched. Therefore, the periodic grating required for single mode, gain coupled operation may be readily formed in the upper active region of the present invention.

In this embodiment the lower active region is illustrated as having five quantum wells and the upper active region as having three quantum wells. One of skill in the art will appreciate that the composition and number of quantum wells in the upper and lower active regions may be varied to provide a particular level of gain and or feedback as. Therefore, the disclosed optical cavity is by way of example only and not by way of limitation.

Figure 3:
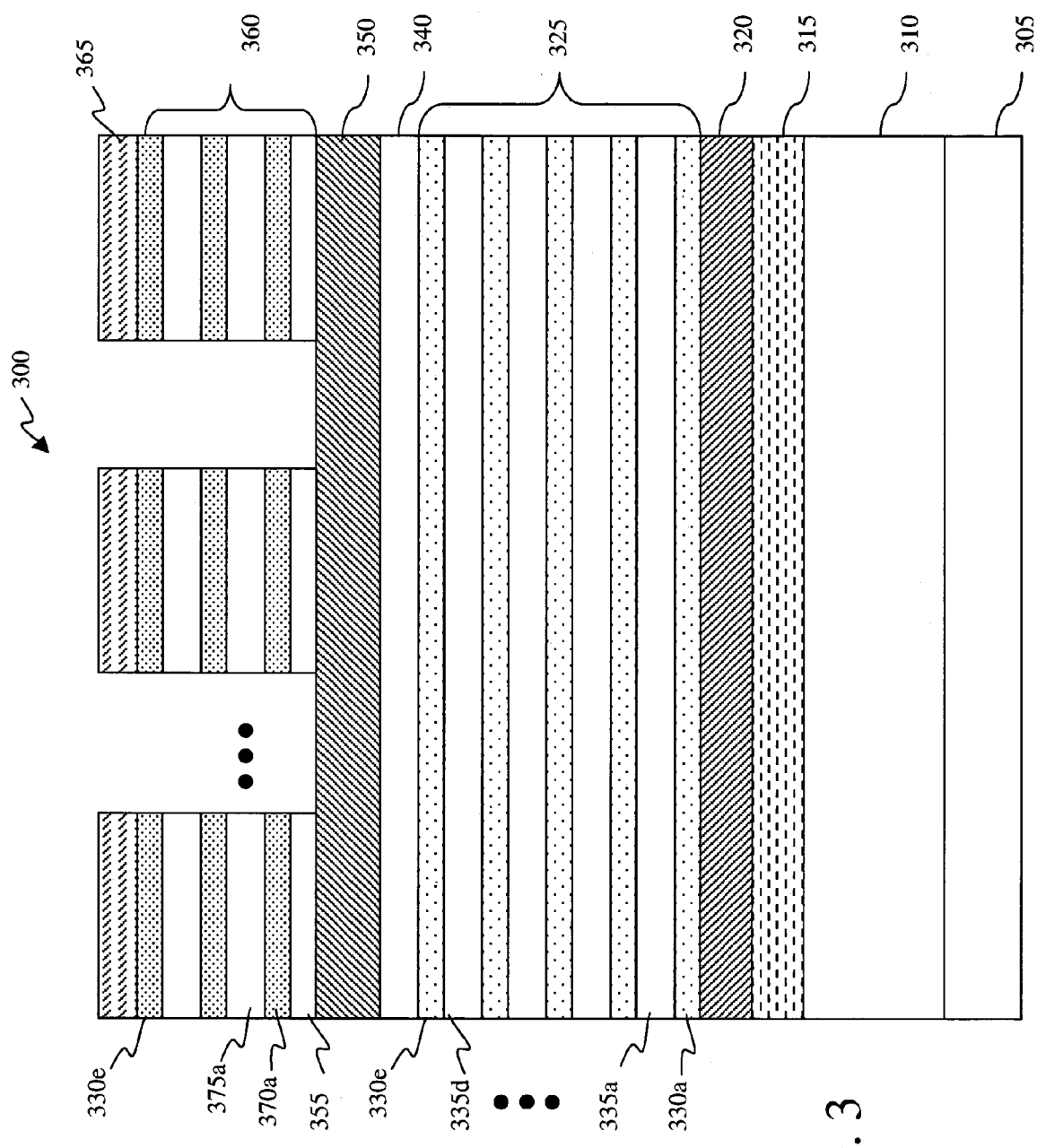
FIG. 3 is a cross sectional view of a light emitting device having a multi-quantum well lower active region and a diffraction grating multi-quantum well upper active region in accordance with an exemplary embodiment of the present invention in accordance with an exemplary embodiment of the present invention.

In order to appreciate the advantages of the present invention, it will be beneficial to describe the invention in the context of an exemplary DFB laser. In FIG. 3, an exemplary DFB laser 300 includes a lower n-type InAlAs cladding layer 315 and an n-type InP buffer layer 310 formed on an InP substrate 305. In one embodiment the n-type InP buffer layer 310 and lower cladding layer 315 are doped with a suitable n-type dopant, such as for example, silicon, selenium or the like, with a concentration in the range of about $1\times10^{16}$–$1\times10^{20}$ cm$^{-3}$.

In this embodiment, a lower undoped separate confinement heterostructure (SCH) layer 320 of InAlGaAs is formed adjacent the n-type lower cladding layer 315. In addition, a multi-quantum-well (MQW) lower active region 325 comprising undoped InAlGaAs quantum wells 330(a–e) with undoped InAlGaAs barrier layers 335(a–d) therebetween is formed adjacent the lower SCH layer 320. In this embodiment the multi-quantum-well (MQW) lower active region 325 includes five InAlGaAs quantum wells 330(a–e) that are approximately 50 Angstroms thick separated by 100 Angstrom thick InAlGaAs barrier layers 335(a–d). In addition, an undoped 100 angstrom thick cap layer 340 of InAlGaAs is formed adjacent the uppermost quantum well layer 330(e).

One of skill in the art will appreciate that the fractional concentrations of In, Al, Ga and As of the layers in the lower active region may be varied to provide bandgap energy levels as may be preferable for the formation of the DFB laser 300. In one embodiment, however, the lower SCH layer 320 and the cap layer 340 are quaternary materials with a light emitting wavelength of approximately one micron, (i.e. Q(1.0)).

In this embodiment the barrier layers 335(a–d) are strained (tensile) to offset the compressive strain of the quantum wells 330(a–e). In addition, the barrier layers 335(a–d) are formed from a quaternary material with a light emitting wavelength of approximately one micron, (i.e. Q(1.0)). Further, the quantum well layers 330(a–e) in this embodiment have a peak photoluminescence in the range of about 1300–1310 nm.

In this embodiment a buffer layer 350 is formed adjacent the cap layer 340. In one embodiment the buffer layer 350 is a 200 Angstrom thick layer of a high band gap material such as InP and is doped with the same dopant type as the upper cladding layer (not shown). In an exemplary embodiment the buffer layer 350 is doped with a suitable p-type dopant, such as for example, zinc (Zn), beryllium (Be) or the like, with a concentration in the range of about $1\times10^{16}$–$1\times10^{18}$ cm$^{-3}$.

In this embodiment an undoped InGaAsP barrier layer 355 having a thickness of approximately 50 Angstroms is formed adjacent the buffer layer 350. In addition, an undoped multi-quantum-well (MQW) upper active region 360 is formed adjacent the barrier layer 355 followed by an upper undoped SCH layer of InGaAsP 365 having a thickness of approximately 100 Angstroms.

In this embodiment the multi-quantum-well (MQW) upper active region 360 comprises undoped quantum wells 370(a–c) with undoped barrier layers 375(a–b) therebetween. In the described exemplary embodiment the upper active region is formed from a low reactivity material system. For example, in one embodiment the multi-quantum-well (MQW) upper active region 360 includes three InGaAsP quantum wells 370(a–c) that are approximately 50 Angstroms thick separated by 100 Angstrom thick InGaAsP barrier layers 375(a–b).

One of skill in the art will again appreciate that the fractional concentrations of In, Ga, As and P of the layers in the upper active region may be varied to provide bandgap energy levels as may be preferable for the formation of the DFB laser 300. In one embodiment, however, the upper SCH layer 365 and the barrier layer 355 are quaternary materials with a light emitting wavelength of approximately 1.1 micron, (i.e. Q(1.1)).

In addition, in this embodiment the barrier layers 375(a–b) are strained (tensile) to offset the compressive strain of the quantum wells 370(a–c). The barrier layers 375(a–b) are formed from a quaternary material with a light emitting wavelength of approximately 1.1 micron, (i.e. Q(1.1)). Further, the quantum well layers 370(a–c) have a peak photoluminescence wavelength in the range of about 1300–1310 nm. One of skill in the art will appreciate that the upper and lower active regions need not be designed to have the same peak photoluminescence wavelength.

In an exemplary embodiment the upper surface of the upper SCH layer 365 is holographically patterned and a periodic grating is etched into the upper SCH layer 365, the upper active region 360 and barrier layer 355 using well known techniques to form a periodic grating therein. As is known in the art the period of the grating may be adjusted in accordance with the operating wavelength of the device. In one embodiment the buffer layer 350 serves as an etch stop layer during the formation of a periodic grating in the upper active region 360.

Figure 4:
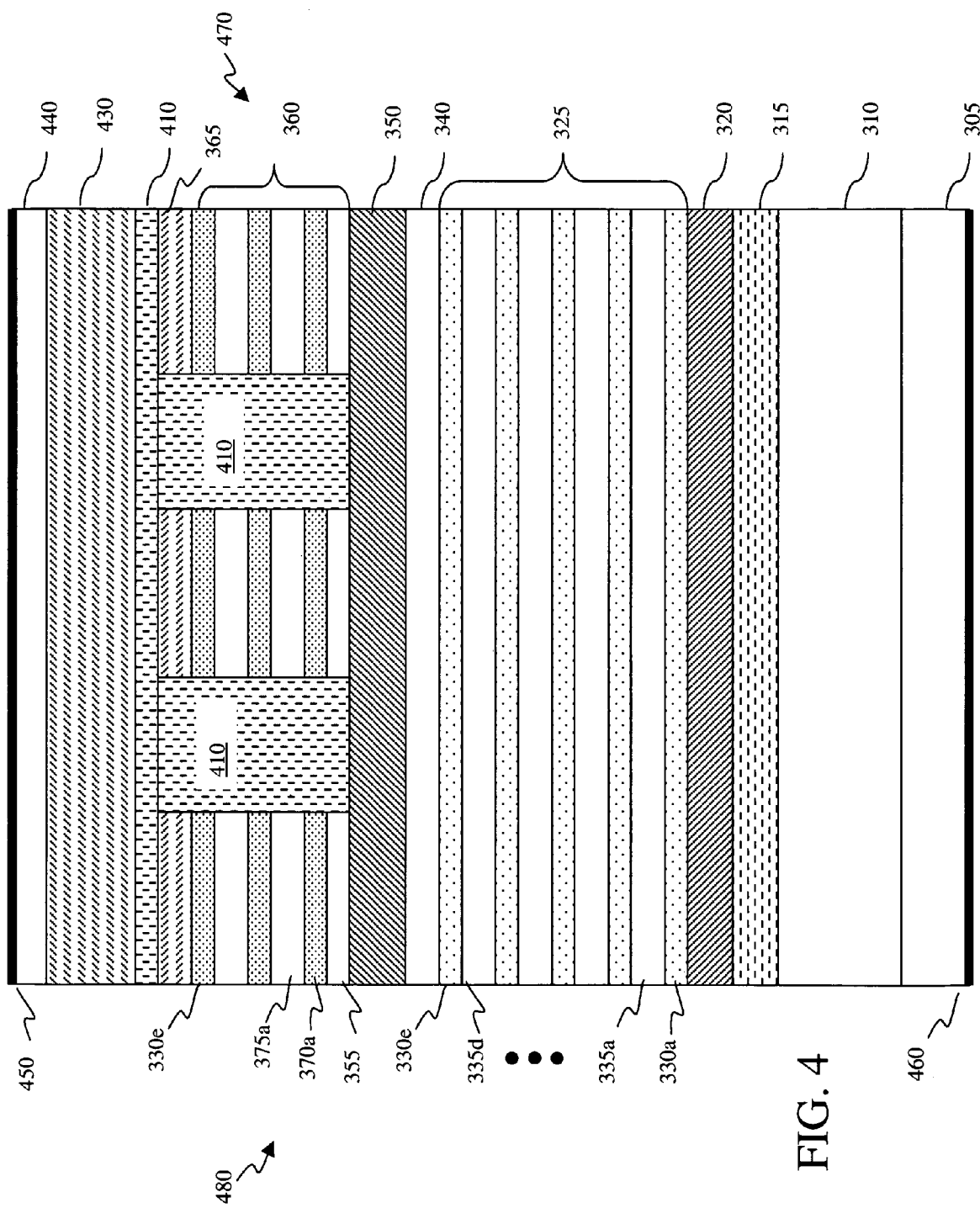
FIG. 4 is a cross-sectional view of the light emitting device of FIG. 3 with a filler layer formed between the periodic elements of the diffraction grating in accordance with an exemplary embodiment of the present invention.

Referring to FIG. 4, in this embodiment a p-type InP or InGaAsP filler 410 is formed adjacent to and between the grating elements formed in the upper SCH layer 365. A 1000 Angstrom, p-type upper cladding layer 430 and a 100 Angstrom p-type cap layer 440 are formed adjacent to the filler 410. In an exemplary embodiment, the p-type filler 410, upper cladding layer 430 and cap layer 440 are doped with suitable dopants known in the art, such as, for example, zinc (Zn) or beryllium (Be) or the like. In one embodiment the filler 410 and the upper cladding layer 430 are, by way of example, doped with a concentration in the range of about $1\times10^{16}$–$1\times10^{19}$ cm$^{-3}$. In this embodiment the cap layer 440 is more heavily doped than the upper cladding layer 430, typically with a concentration in the range of about $3\times10^{16}$–$3\times10^{19}$ cm$^{-3}$.

In an exemplary embodiment the DFB laser is contacted by a p-type contact 450 and an n-type contact 460 that are used to inject current into the laser. In addition the end facets 470 and 480 of the laser are cleaved and may receive coatings or other treatment to adjust the amount of optical feedback in the laser diode.

As is well known in the art the first and second growth cycles used to form the illustrated complex coupled laser may be performed by known growth techniques such as metal organic chemical vapor deposition (MOCVD) or metal organic vapor phase epitaxial growth (MOVPE) or the like. In addition, the growth technique, material composition, layer thicknesses, etc. specified above are intended to illustrate one example only and the invention is not limited to this configuration or composition.

Rather, as indicated previously, other material systems can be substituted for those described herein. For example, in one embodiment high band gap material systems such as AlGaAsSb or InGaAsSb may be used to form the lower active region in conjunction with InGaAsP and InGaAs in the upper active region. Similarly, for short wavelength applications (i.e. 850/980 nm), the lower active region may be formed from the AlGaAs/GaAs material system and the upper active region may be formed from the InGaAs/InGaP material system.

Those skilled in the art will also understand that various modifications may be made to the described exemplary embodiments. For example, the features of the described exemplary DFB lasers may be combined in a variety of different manners to form high performance devices. For example, light emitting devices, such as the described exemplary DFB laser, are often manufactured in the form of arrays, wherein a plurality of devices are epitaxially grown on a common substrate. In addition, the present invention is equally applicable to the formation of various waveguide lasers such as for example, a ridge waveguide laser as well as a buried hetero-structure, buried rib, or other types of lasers.

Moreover, to those skilled in the various arts, the invention itself herein will suggest solutions to numerous tasks and adaptations for numerous applications. It is therefore desired that the present embodiments be considered in all respects as illustrative and not restrictive, reference being made to the appended claims rather than the foregoing description to indicate the scope of the invention.

What is claimed is:

1. A distributed feedback laser for generating a laser light, the distributed feedback laser comprising:
   a semiconductor substrate;
   a first cladding layer disposed on or over the semiconductor substrate;
   a second cladding layer, the first cladding layer and the second cladding layer forming an optical waveguide for the laser light; and
   an optical cavity disposed between the first cladding layer and the second cladding layer and used to generate the laser light, the optical cavity comprising a first active region comprising at least one first active layer formed of a high reactivity material, the at least one first active layer extending continuously in a direction of propagation of the laser light, and a second active region comprising at least one second active layer formed of a low reactivity material, the high reactivity material being more susceptible to oxidation when etched than the low reactivity material.

2. The distributed feedback laser of claim 1, wherein the second active region comprises a plurality of periodic structure elements arranged in the direction of propagation of the laser light.

3. The distributed feedback laser of claim 2, wherein the plurality of periodic structure elements are formed by etching grooves through the at least one second active layer to form a grating.

4. The distributed feedback laser of claim 3, further comprising a buffer layer disposed between the first active region and the second active region, wherein the buffer layer serves as an etch stop layer when forming the plurality of periodic structure elements.

5. The distributed feedback laser of claim 4, wherein the first and second cladding layers are doped with opposite dopant types, and wherein the buffer layer is doped with same dopant type as the second cladding layer.

6. The distributed feedback laser of claim 4, further comprising a filler layer formed adjacent and between the plurality of periodic structure elements.

7. The distributed feedback laser of claim 1, wherein at least one of the first active region and the second active region comprises a single quantum well active region, a multi-quantum well active region, quantum wires or quantum dots.

8. The distributed feedback laser of claim 1, wherein the first active region comprises a first multi-quantum well active region including a plurality of first active layers separated by a plurality of first barrier layers and the second active region comprises a second multi-quantum well active region including a plurality of second active layers separated by a plurality of second barrier layers.

9. The distributed feedback laser of claim 8, wherein conduction band offsets for the first multi-quantum well active region is larger than conduction band offsets for the second multi-quantum well active region.

10. The distributed feedback laser of claim 9, wherein an optical gain and a differential gain of the first multi-quantum well active region is higher than an optical gain and a differential gain of the second multi-quantum well active region.

11. The distributed feedback laser of claim 1, wherein the high reactivity material comprises aluminum.

12. The distributed feedback laser of claim 1, wherein the high reactivity material comprises antimony.

13. A distributed feedback laser for generating a laser light, the distributed feedback laser comprising:
  a semiconductor substrate;
  a lower cladding layer disposed on or over the semiconductor substrate;
  an upper cladding layer, the upper cladding layer and the lower cladding layer forming an optical waveguide for the laser light; and
  an optical cavity disposed between the lower cladding layer and the upper cladding layer and used to generate the laser light, the optical cavity comprising a lower active region comprising one or more lower active region quantum wells formed of a high reactivity material, the one or more lower active region quantum wells extending continuously in a direction of propagation of the laser light, and an upper active region comprising one or more upper active region quantum wells formed of a low reactivity material, the high reactivity material being more susceptible to oxidation when etched than the low reactivity material.

14. The distributed feedback laser of claim 13, wherein the upper active region comprises a plurality of periodic structure elements arranged in the direction of propagation of the laser light.

15. The distributed feedback laser of claim 14, wherein the high reactivity material comprises aluminum.

16. The distributed feedback laser of claim 14, wherein the high reactivity material comprises antimony.

17. The distributed feedback laser of claim 14, further comprising a buffer layer disposed between the lower active region and the upper active region, wherein the buffer layer serves as an etch stop layer when forming the plurality of periodic structure elements in the upper active region.

18. The distributed feedback laser of claim 17, wherein the upper and lower cladding layers are doped with opposite dopant types and wherein the buffer layer is doped with same dopant type as the upper cladding layer.

19. The distributed feedback laser of claim 17, further comprising a filler layer formed adjacent to and between the plurality of periodic structure elements of the upper active region.

20. The distributed feedback laser of claim 13 wherein conduction band offsets for the lower active region is larger than conduction band offsets for the upper active region.

21. A method for eliminating mode degeneracy and providing single longitudinal mode oscillation in a distributed feedback (DFB) laser, the method comprising:
  forming a first cladding layer on or over a semiconductor substrate;
  forming a first active region on or over the first cladding layer, the first active region comprising a high reactivity material extending continuously in a direction of propagation of the laser light;
  forming a second active region to form an optical cavity comprising the first and second active regions and for generating a laser light, the second active region comprising a plurality of periodic structure elements comprising a low reactivity material and arranged in the direction of propagation of the laser light; and
  forming a second cladding layer on or over the second active region, the first and second cladding layers forming an optical guide for the laser light.

22. The method of claim 21, wherein the high reactivity material comprises aluminum.

23. The method of claim 21, wherein the high reactivity material comprises antimony.

24. The method of claim 21, further comprising forming a buffer layer on the first active region prior to forming the second active region, wherein the buffer layer serves as an etch stop layer when forming the plurality of periodic structure elements in the second active region.

25. The method of claim 21, further comprising depositing a filler layer adjacent to and between the plurality of periodic structure elements of the second active region.

* * * * *